United States Patent
Brett et al.

(10) Patent No.: US 10,305,264 B2
(45) Date of Patent: May 28, 2019

(54) POWER DISTRIBUTION RACK ASSEMBLY

(71) Applicant: GE Aviation Systems Limited, Gloucestershire (GB)

(72) Inventors: John Michael Brett, Cheltenham (GB); Christopher Andrew Leivers, Cheltenham (GB); John Oliver Collins, Windham, NH (US)

(73) Assignee: GE Aviation Systems Limited, Cheltenham, Gloucestershire (GB)

( * ) Notice: Subject to any disclaimer, the term of this patent is extended or adjusted under 35 U.S.C. 154(b) by 0 days.

(21) Appl. No.: 15/557,644

(22) PCT Filed: Mar. 12, 2015

(86) PCT No.: PCT/EP2015/055235
§ 371 (c)(1),
(2) Date: Sep. 12, 2017

(87) PCT Pub. No.: WO2016/141999
PCT Pub. Date: Sep. 15, 2016

(65) Prior Publication Data
US 2018/0069383 A1 Mar. 8, 2018

(51) Int. Cl.
*H02B 1/34* (2006.01)
*H02B 1/20* (2006.01)
*B64D 47/00* (2006.01)
*H05K 7/14* (2006.01)

(52) U.S. Cl.
CPC ............ *H02B 1/34* (2013.01); *B64D 47/00* (2013.01); *H02B 1/20* (2013.01); *H05K 7/1457* (2013.01); *B64D 2221/00* (2013.01)

(58) Field of Classification Search
CPC .......... H02B 1/34; H02B 1/20; H05K 7/1457; B64D 47/00; B64D 2221/00
USPC ....................................................... 361/624
See application file for complete search history.

(56) References Cited

U.S. PATENT DOCUMENTS

| | | | | |
|---|---|---|---|---|
| 4,164,362 A * | 8/1979 | Cobaugh | ............... | H01R 13/514 439/64 |
| 4,241,381 A * | 12/1980 | Cobaugh | ............... | H05K 7/1457 361/624 |
| 4,277,120 A * | 7/1981 | Drake | ................... | H05K 7/1425 312/111 |
| 4,503,484 A * | 3/1985 | Moxon | ................ | H05K 7/1441 361/692 |
| 4,750,088 A * | 6/1988 | Friot | .................... | H05K 7/1418 211/41.17 |

(Continued)

OTHER PUBLICATIONS

International Search Report and Written Opinion issued in connection with corresponding PCT Application No. PCT/EP2015/055235 dated Oct. 21, 2015.

(Continued)

*Primary Examiner* — Anatoly Vortman
(74) *Attorney, Agent, or Firm* — McGarry Bair PC

(57) ABSTRACT

An apparatus for distributing power from a power source to a set of power outputs using a power distribution rack includes a manifold having a set of bus bar channels in a wall, a set of electronic cards, and a set of bus bars received in the set of bus bar channels and coupling a power source to the electronic cards, wherein the electronic cards route the power from the power source to the power outputs.

20 Claims, 6 Drawing Sheets

(56) References Cited

U.S. PATENT DOCUMENTS

| | | | | |
|---|---|---|---|---|
| 4,818,240 | A * | 4/1989 | Karner | H05K 1/141 |
| | | | | 439/377 |
| 4,845,592 | A * | 7/1989 | Himes, Jr. | H02G 5/005 |
| | | | | 361/775 |
| 4,846,699 | A * | 7/1989 | Glover | H01R 12/7005 |
| | | | | 439/64 |
| 5,022,863 | A * | 6/1991 | Keens | H05K 7/1418 |
| | | | | 439/108 |
| 5,086,372 | A * | 2/1992 | Bennett | H01R 12/7088 |
| | | | | 361/622 |
| 6,205,029 | B1 * | 3/2001 | Byrne | H05K 7/1457 |
| | | | | 174/68.2 |
| 6,522,554 | B1 * | 2/2003 | Gomez | H05K 7/1418 |
| | | | | 361/727 |
| 7,170,755 | B2 * | 1/2007 | Keller | H05K 7/1454 |
| | | | | 361/727 |
| 7,277,296 | B2 * | 10/2007 | Ice | H05K 7/1404 |
| | | | | 361/679.41 |
| 7,458,815 | B2 * | 12/2008 | Fallah-Adl | H05K 7/1451 |
| | | | | 361/695 |
| 7,520,759 | B2 * | 4/2009 | Seff | H02B 1/056 |
| | | | | 439/76.2 |
| 2003/0016520 | A1 | 1/2003 | Cooney et al. | |
| 2005/0170678 | A1 * | 8/2005 | Donahue, IV | H01R 13/514 |
| | | | | 439/214 |
| 2012/0194969 | A1 | 8/2012 | Johnsen | |
| 2014/0247540 | A1 | 9/2014 | Steeves et al. | |

OTHER PUBLICATIONS

International Preliminary Report on Patentability issued in connection with corresponding PCT Application No. PCT/EP2015/055235 dated Sep. 12, 2017.

* cited by examiner though the bus bar assembly has been described with
respect to a particular set of slots and apertures it will be
understood that other configurations are possible.

POWER DISTRIBUTION RACK ASSEMBLY

BACKGROUND

Electrical power systems, such as those found in an aircraft power distribution system, employ power generating systems or power sources, such as generators, for generating electricity for powering the systems and subsystems of the aircraft. As the electricity traverses electrical bus bars to deliver power from power sources to electrical loads, power distribution nodes dispersed throughout the power system ensure the power delivered to the electrical loads meets the designed power criteria for the loads. Power distribution nodes can, for instance, further provide step-up or step-down power conversion, direct current (DC) to alternating current (AC) power conversion or AC to DC power conversion, or switching operations to selectively enable or disable the delivery of power to particular electrical loads, depending on, for example, available power distribution supply, criticality of electrical load functionality, or aircraft mode of operation, such as take-off, cruise, or ground operations.

Typical power distribution nodes include one or more rack assemblies for including, for example, a number of electronic cards to provide for the aforementioned conversions or switching functions. The rack assemblies are not typically optimized to be contained within the smallest configurable installation volume, leading to rack assemblies larger than necessary, and unused or underutilized components.

BRIEF DESCRIPTION

In one aspect, a power distribution rack assembly includes a manifold having a set of slots within the manifold, a wall with a set of bus bar channels extending along at least a portion of the wall normal to the slots, the set of bus bar channels having a set of apertures in the wall, at least one electronic card having at least one power input connector, at least one power output connector, and power electronics configured to route power received at the at least one power input connector to the at least one power output connector, and wherein the at least one electronic card is configured to be received in the set of slots, and a set of bus bar conductors dimensioned to be received in the set of bus bar channels, and adapted to receive power from a power source, the set of bus bar conductors having at least one electrical contact connected thereto and dimensioned to extend through the set of apertures. The at least one electronic card can be selectively received in the set of slots, and the set of bus bar conductors can be selectively received in the set of bus bar channels, with the at least one electrical contact selectively coupled with the at least one power input connector to selectively configure continuity between the power source and the at least one power output connector.

In another aspect, a power distribution rack includes a set of slots included in a manifold configured to receive a set of electronic cards having at least one power input connector, at least one power output connector, and power electronics configured to route power received at the at least one power input connector to the at least one power output connector, a set of bus bar channels disposed in the manifold normal to the set of slots, at least one aperture positioned in the set of bus bar channels providing access to a set of electronic cards received in the set of slots, and a set of bus bar conductors received in the set of bus bar channels, and configured to connect to a power source, the set of bus bar conductors having at least one electrical contact connected thereto and extending through the at least one aperture. The at least one electrical contact can be coupled with the at least one power input connector of a set of electronic cards received in the set of slots to establish continuity between the power source and the at least one power output connector.

In yet another aspect, a modular bus bar connection system includes a manifold having a set of slots adapted to receive a set of electronic cards, a set of bus bar channels disposed in a wall of the manifold normal to the set of slots and having a set of apertures through the wall, a set of bus bar segments configured to be received in the set of bus bar channels and having at least one end adapted to couple with a power source, and a set of electrical contacts coupled with the set of bus bar segments and configured to extend through the set of apertures and couple with a set of electronic cards received in the set of slots. The set of bus bar segments is selected and arranged in the set of bus bar channels to couple with a selected set of electronic cards received in the set of slots.

DETAILED DESCRIPTION

The described embodiments of the present invention are directed to a method and apparatus associated with a modular power distribution rack. One example environment where such a method and apparatus can be used includes, but is not limited to, a power distribution system for an aircraft. While this description is primarily directed toward a power distribution system for an aircraft, it is also applicable to any environment using a nodal-based power distribution system where input power is received, acted upon (if necessary), e.g., converted or modified, and distributed to one or more electrical loads.

Figure 1:
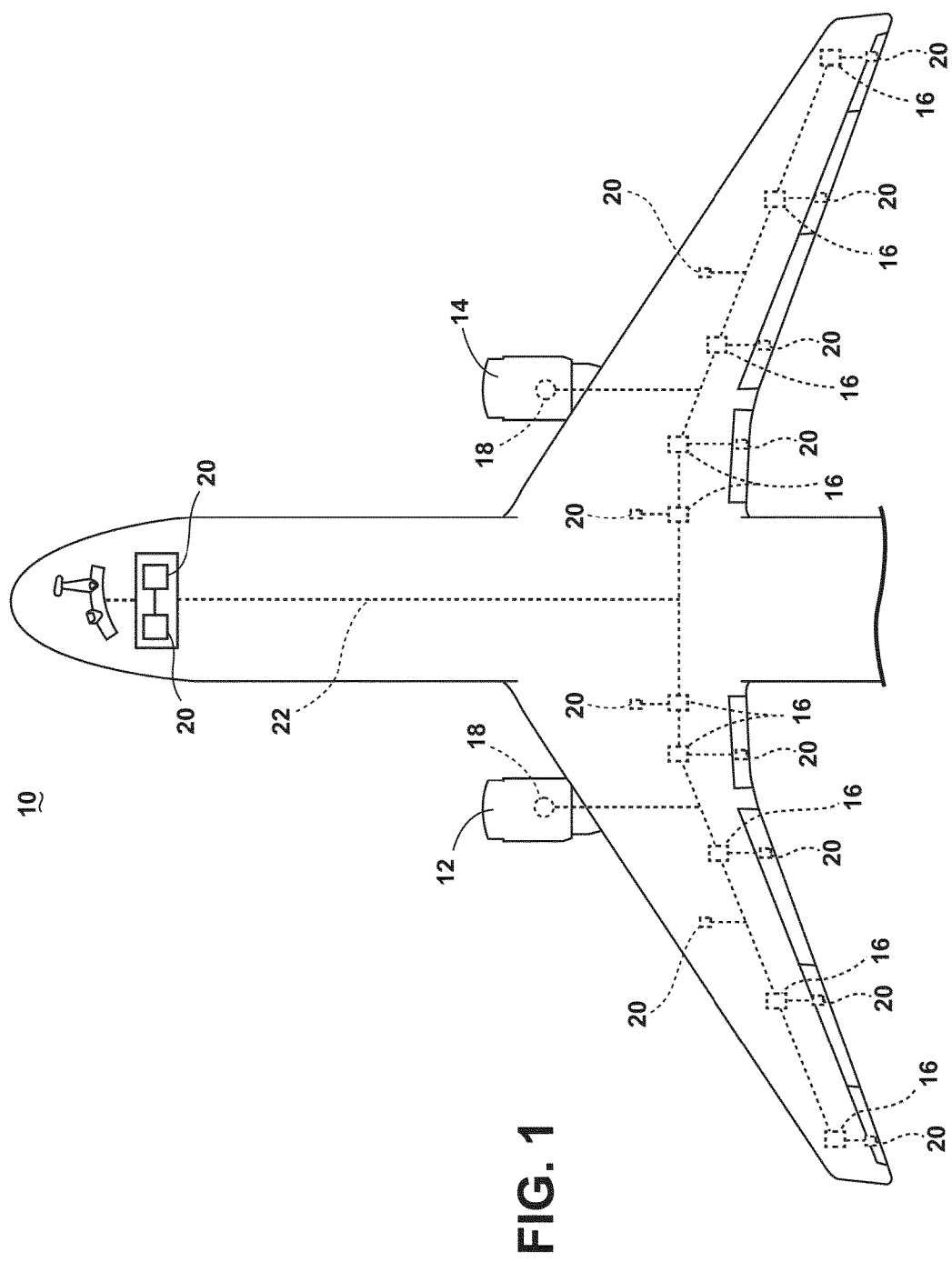
FIG. 1 is a top down schematic view of the aircraft and power distribution system of an aircraft.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated embodiment of the invention of FIG. 1 is only one non-limiting example of a power distribution system, and many other possible embodiments and configurations in addition to that shown are contemplated by the present disclosure. Furthermore, the number of, and placement of, the various components depicted in FIG. 1 are also non-limiting examples of embodiments associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which delivers the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. Additional management functions can be included. Furthermore, additional power sources for providing power to the electrical loads 20, such as emergency power sources, ram air turbine systems, starter/generators, or batteries, can be included, and can substitute for the power source. It will be understood that while one embodiment of the invention is shown in an aircraft environment, the invention is not so limited and has general application to electrical power systems in non-aircraft applications, such as other mobile applications and non-mobile industrial, commercial, and residential applications.

Figure 2:
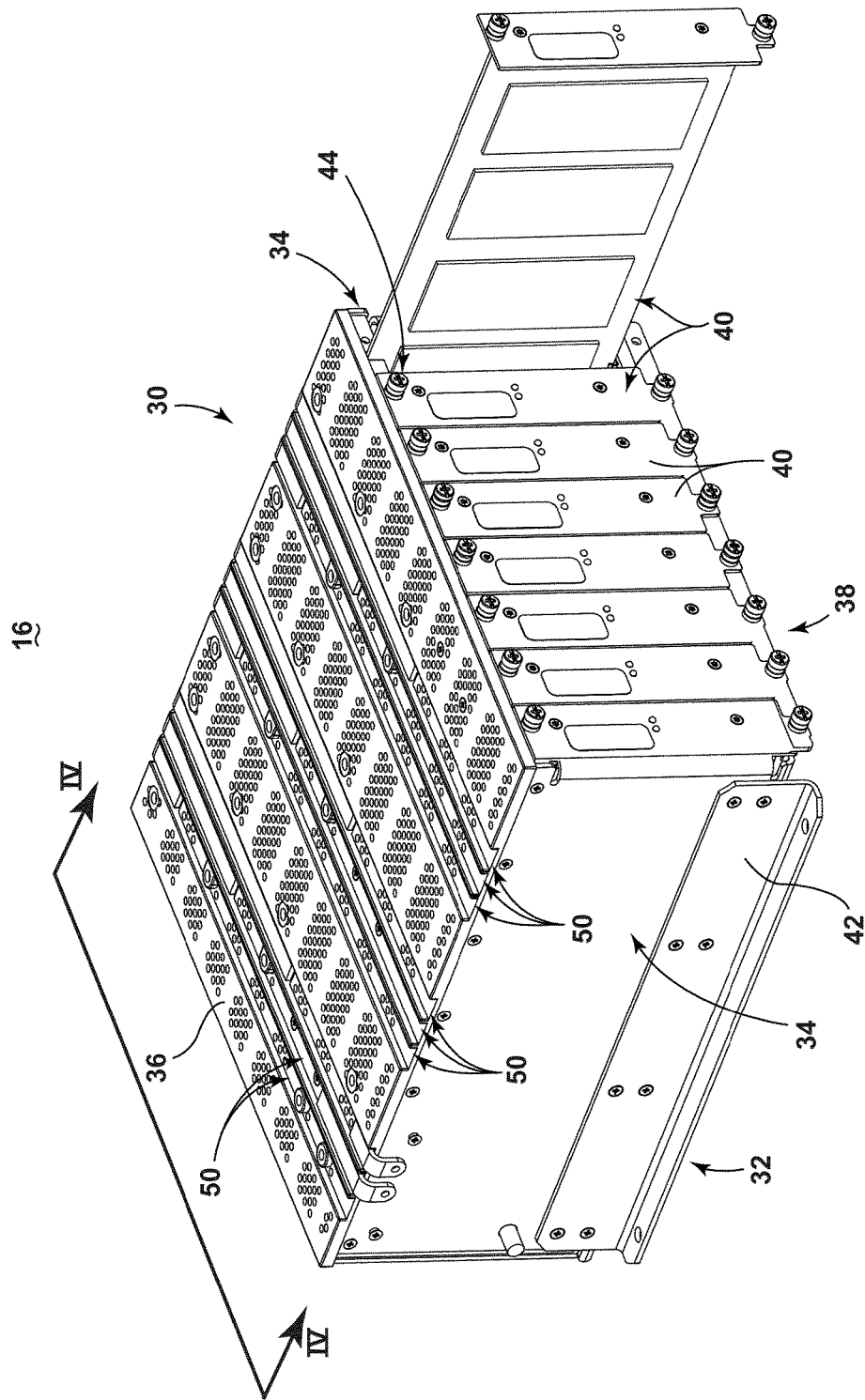
FIG. 2 is a perspective view of a power distribution rack assembly.

FIG. 2 illustrates an embodiment of the power distribution node 16 in the form of a power distribution rack assembly 30. The rack assembly 30 can include a manifold 32 having a box-like configuration, as shown, with opposing electrically non-conductive sidewalls 34, an electrically non-conductive top wall 36, and an electrically non-conductive bottom wall 38 opposite the top wall 36. At least one wall of the rack assembly 30, shown here as the top wall 36, can further include a set of bus bar channels 50 extending along at least a portion of the top wall 36. The manifold 32 further defines a set of slots 44 within the manifold, configured to receive and guide electronic cards 40 to be installed within the manifold. The slots 44 can be defined by projections on one or more of the walls, such as the top and bottom walls 36, 38, such projections including but not limited to ribs, ridges, bosses, and the like. The slots 44 can be arranged such that a set of electronic cards 40 received in the slots 44 will be normal, that is, perpendicular to the bus bar channels 50. In FIG. 2, the electronic card 40 is shown positioned in parallel, with respect to other cards 40, and with respect to the sidewalls 34, with one electronic card 40 partially received in a corresponding slot 44.

While the set of electronics cards 40 are further positioned in parallel with respect to, and in between, the opposing sidewalls 34, embodiments of the disclosure can include configurations where a subset of electronic cards 40 are configured in parallel, or wherein different subsets of the electric cards 40 are configured in different parallel configurations. Furthermore, while the rack assembly 30 is illustrated in a manifold 32, alternative manifold configurations (e.g. shapes, contours, profiles) are contemplated, and can be at least partially determined based on space limitation in the operating environment.

Additionally, while the above-described rack assembly 30 defines sidewalls 34, a top wall 36, and a bottom wall 38, it is understood that the walls 34, 36, 38 can be interchangeably defined based on the position, rotation, and placement of the rack assembly 30, itself. For example, while the top wall 36 is illustrated as the upright, horizontal upper wall in FIG. 2, a 90 degree clockwise rotation of the rack assembly 30, for instance, as necessary for mounting the assembly 30 in an aircraft, can result in the previously top wall 36 effectively aligned as a sidewall 34. Thus, it will be understood references to "top," "bottom," and "side" walls 34, 36, 38 are only with reference to the figures shown, and can be interchangeable in practice.

At least a set of the aforementioned walls 34, 36, 38 can provide the structural rigidity needed for the rack assembly 30 to retain an intended shape, contour, or profile, as well as to support the set of electronic cards 40 and any necessary environmental consideration, including but not limited to, aircraft vibrations or forces applied to the assembly 30 during take-off and landing. For example, the rack assembly 30 is shown having a mounting bracket 42 for mounting at least a portion of the assembly 30 with another structure, such as an aircraft surface or wall. Any suitable mounting materials or mounting techniques can be utilized, and can include, but are not limited to, mechanical fasteners, screws, epoxy, adhesive, or force or tension mountings.

Furthermore, while the sidewalls 34 or bottom wall 38 has been described as electrically non-conductive, embodiments of the invention can include walls 34, 38 machined or manufactured from electrically conductive materials, including but not limited to, aluminum, copper, and the like, to provide the required rigidity, and coated with a non-conductive paint, epoxy, or material to provide non-conductive qualities as may be necessary to preserve continuity in electrical components. Alternatively, embodiments of the invention can include sidewalls 34, bottom wall 38, and or mounting brackets 42 that are at least partially electrically conductive, for example, to provide an electrical grounding path for any electronics incorporated into the rack assembly 30. Moreover, while not germane to the invention, embodiments of the rack assembly 30 can also include pores, perforations, or inlet/outlet combinations to provide for a coolant, such as air or liquid, to traverse the internal rack assembly 30, as suitable or needed for heat management design concerns.

Figure 3:
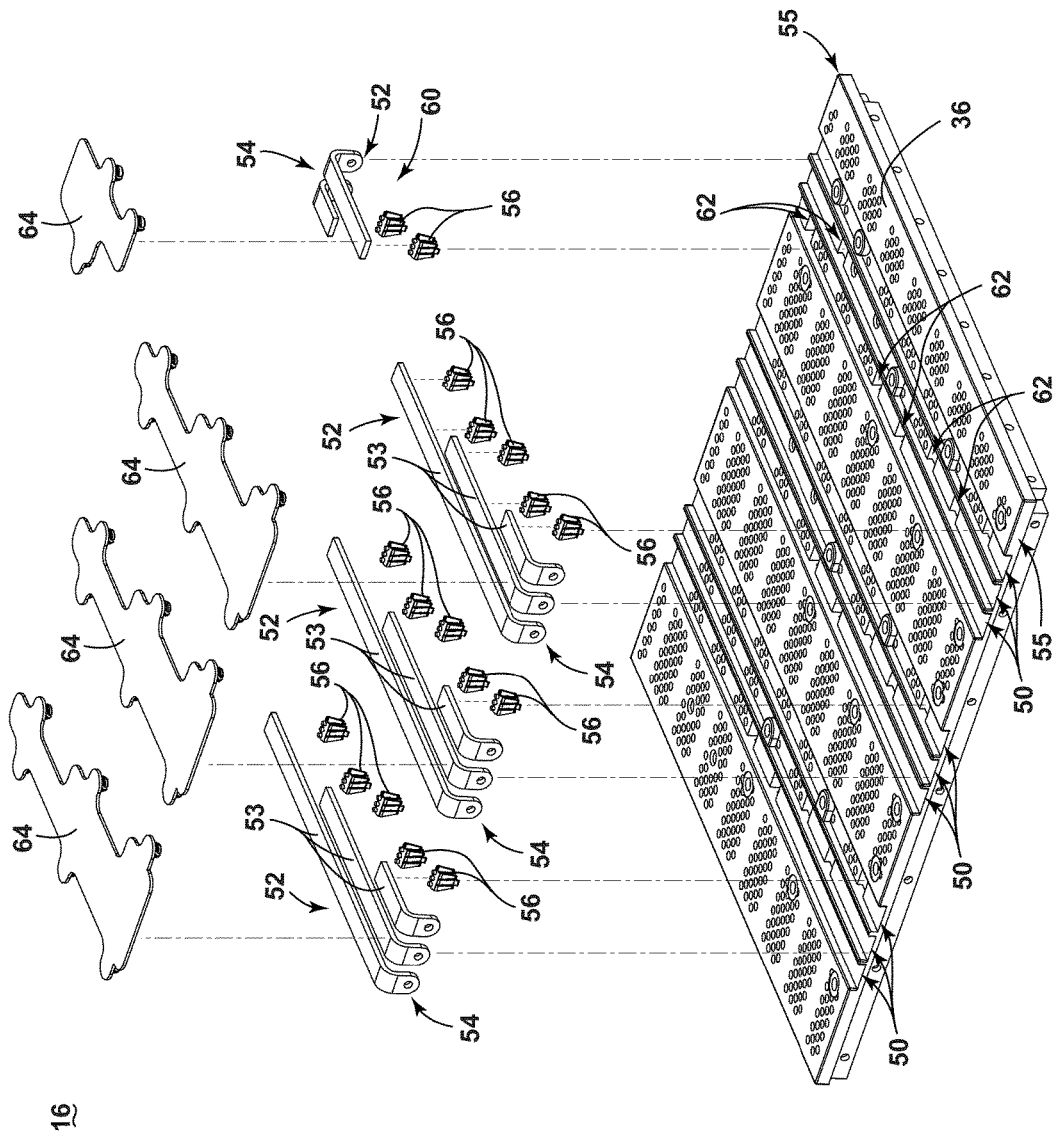
FIG. 3 is an exploded perspective view of a wall of the power distribution rack assembly having bus bar conductors.

Turning now to FIG. 3, the rack assembly 30 can further include at least one set of bus bar conductors 52 dimensioned to be received in a corresponding set of bus bar channels 50. As shown, the sets of bus bar conductors 52 can include any number of electrically conductive bus bar segments 53. The segments 53 can include a first end 54 and one or more electrical contacts 56. The electrical contacts 56 can include, for example, spring clips (as shown in FIG. 3), extending away from the respective segment 53. The first end 54 can be configured or adapted to mount to, or serve as, a connector with a power source (not shown). In addition, the first end 54 can be positioned such that when the set of bus bar conductors 52 is received in the corresponding bus bar channel 50, the first end can extend past an edge 55 of the wall having the channels 50, such as the top wall 36. Stated another way, the first end 54 can be configured to extend past the wall end, to effect the electrical coupling with the power source.

The set of bus bar conductors 52 can include a varying set or number of bus bar segments 53, and can further include different segment lengths for the segment 53. In this sense, the set of bus bar conductors 52 can collectively extend in at least a portion of the corresponding bus bar channels 50 by way of different segments 53. For example, as shown, a first set 58 of bus bar conductors 52 can have segment lengths and a number of segments 53, that differs from the segment lengths and number of bus bar conductors 52 in a second set 60 of bus bar conductors 52. While a number of sets of bus bar conductors 52 are illustrated having similar lengths and numbers of bus bar segments 53, any integration of the aforementioned configurations can be included in embodiments of the invention, for example, but not limited to, having a different number of segments 53 for the set of conductors 52, or different lengths for the segment 53, set of conductors 52, or combination of respective segments 53 for the set of conductors 52. For example, embodiments of the invention can include a segment that extends along the full length of a corresponding bus bar channel 50. In other words, the number, lengths, and arrangement of bus bar conductors 52 is fully configurable and selectable for any rack assembly 30.

The bus bar segment 53 can further be configured to include the set of electrical contacts 56, such as spring clips, electrically coupled with the respective segment 53, and positioned to extend through a corresponding set of apertures 62 in the bus bar channels 50 or wall 36 having the bus bar channels 50, when the set of conductors 52 is received by the channels 50. It will be understood that the set of apertures 62 in the bus bar channel 50 may be as few as a single elongated aperture extending over part or most of the bottom of bus bar channel 50 with a portion of the bottom on the side of the aperture 62 supporting the bus bar channel 50. The electrical contact 56 can be further configured or dimensioned to extend at least partially through the corresponding aperture 62 to reach within the box rack assembly 30 to electrically couple with another component, such as one or more of the electronic cards 40. While the configuration illustrated indicates a one-to-one configuration of electrical contacts 56 with corresponding apertures 62, embodiments of the invention can include, for example, bus bar channels 50 having a predefined number or position of respective apertures 62 such that only a subset of apertures 62 receive corresponding electrical contacts 56. In another embodiment, the unused or underutilized apertures 62 can be permanently or temporarily filled with a plug or other suitable fill material to prevent unintended electrical coupling of the bus bar segment 53 or set of conductors 52 with a conductive component within the rack assembly 30. The electrical contacts 56 can be electrically coupled with the respective segments 53 by any suitably conductive means, for example, but not limited to, welding, or using mechanical fasteners. Moreover, while spring clips are one non-limiting example of electrical contacts 56, any suitable electrical contact device can be utilized to electrically couple with the electronic cards 40, provided such electrical contacts also allow for, for example, the selective reception of the electrical cards 40 in the slots 44, as described herein.

The rack assembly 30 can further include optional non-conductive segment covers 64 configured to overlie at least one of a segment 53, a set of bus bar conductors 52, or a set of bus bar channels 50, and can couple with the wall having the bus bar channels 50, shown as the top wall 36. Any suitable methods of physical coupling between the covers 64 and the wall 36 can be included, so long as the physical coupling does not implicate any conductive couplings with the respective segments 53. Segment covers 64 can overlie bus bar conductors 52, and/or bus bar channels 50 to provide electrical insulation between the set of bus bar conductors 52 and any external conductive components in the aircraft 10. While the covers 64 are not shown covering the first end 54 of the respective segment 53, alternative embodiments of the invention can include a non-conductive design further overlying one or more first ends 54 to further electrically isolate the power input connector from other conductive components in the aircraft 10. Furthermore, while the covers 64 themselves, as shown, can be fitted, tailored, or keyed to a respective set of bus bar conductors 52 or one or more segments 53 thereof, it will be understood that covers 64 can span the entire length of a bus bar channel 50, span to overlie more than one set of bus bar conductors 52 or segments 53, span the entire surface of the wall 36, or be more contoured to the respective set of bus bar conductors 52 or segments 53 (e.g., overlying squares, rectangles, etc.).

Many other possible embodiments and configurations in addition to that shown in the FIG. 3 are contemplated by the present disclosure. For example, the illustrated embodiment shows that a single bus bar channel 50 or set of channels 50 can receive more than one set of bus bar conductors 52, as shown by the first set 58 of bus bar conductors and second set 60 of bus bar conductors received by a single set of bus bar channels 50, from opposing edges of the wall 36. In this non-limiting example, the of the segments 53 of the first and second set of conductors 58, 60 are electrically isolated from the other by at least a non-conductive space or portion of the respective bus bar channel 50. In another example, the non-conductive covers 64 can further include a non-conductive portion received by the channel 50 to electrically isolate the opposing segments 53. In yet another example, non-conductive segments can be inserted into a bus bar channel 50 to electrically isolate opposing segments 53, which can be further fixed by, for instance, fasteners or the covers 64.

Yet another possible embodiment contemplates that the respective set of bus bar conductors 52, or a subset of bus bar conductors 52, receives a different power input from the at least one power source. For example, the first set 58 of bus bar conductors 52, can be configured to receive alternating current (AC) power at the first end 54 of the segments 53. Further expanding on this embodiment, three corresponding sets of conductors (as shown configured on the same edge 55 of the wall 36 as the first set 58) can receive one phase of three-phase AC power. Alternatively, the first set 58 can be configured to receive three phases of AC power individually at the three segments 53 illustrated in the set 58. Alternatively, an embodiment of the invention contemplates a subset of conductors 52 receiving direct current (DC) power at the first end 54 of segments 53 in the second set 60 of bus bar conductors 52. In such an embodiment, the rack assembly 30 can be configured to, for example, receive all DC power input at the first end 54 of segments 53 at one edge 55 of the wall 36, while all AC power input is received at the first end 54 of segments 53 at the opposing edge 55 of the wall 36 or bus bar channel 50. Alternatively, any combination of AC or DC power, including dissimilar phases, voltages, and the like, can be received at either edge 55 of the wall 36 or channel 50, and delivered to any combination of segments 53 or sets of conductors 52, including but not limited to, individual segments 53 within a single set of conductors 52.

Figure 4:
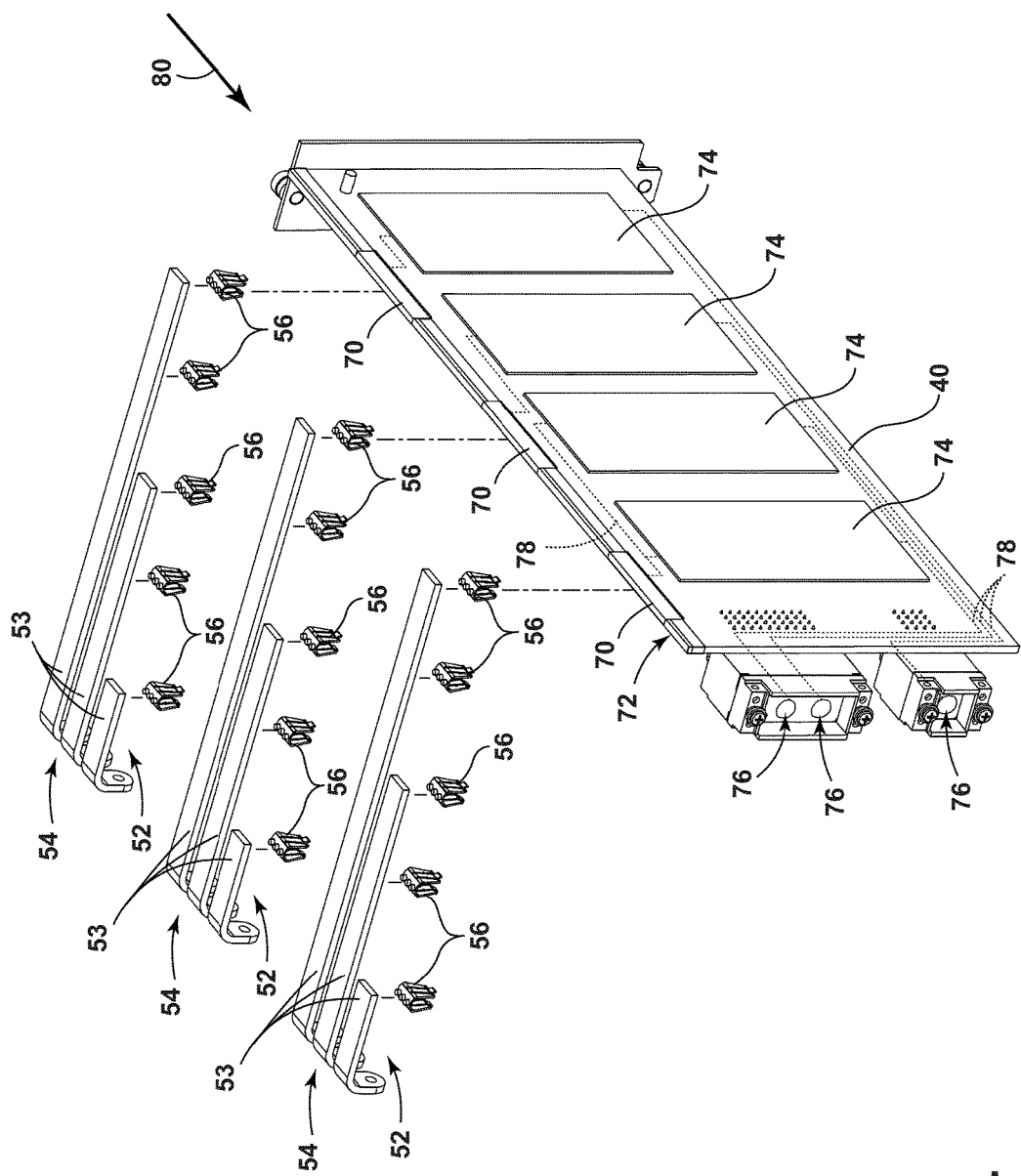
FIG. 4 is a partial exploded perspective view taken along line IV-IV of FIG. 2, illustrating the alignment of the bus bar conductors with the electronic cards, wherein the rack assembly walls have been removed for ease of understanding.

FIG. 4 illustrates a rear-facing perspective view of an example coupling between sets of bus bar conductors 52 and an electronic card 40, taken from line IV-IV of FIG. 2. The rack assembly 30 and walls 34, 36, 38 have been removed from the current view for ease of understanding, however the disclosure contemplates that the coupling between the sets of bus bar conductors 52 and the electronic cards 40 occurs within the assembly 30, itself.

As shown, the electronic cards 40 can further include at least one power input connector 70, shown as a series of three conductive regions on a top edge 72 of the electronic card 40 closest to the sets of bus bar conductors 52, at least one power electronics component 74, and at least one power output connector 76 configured to further electrically couple with an electronic load 20. The power electronics component 74 can be configured to, for example, provide switching operations or power conversion operations (e.g. AC to DC conversion, DC to AC conversion, a first DC power to a second DC power, etc.) to selectively enable or disable the delivery of power to one or more particular electrical loads 20, depending on, for example, available power distribution supply, criticality of electrical load functionality, or aircraft mode of operation, such as take-off, cruise, or ground operations. The electronic cards 40 can be configured to route power received by one or more power input connectors 70, to at least one power electronics component 74 for switching or conversion operations, which is further delivered to at least one power output connector 76. In the illustrated example, the routing of power is shown via conductive paths illustrated in dotted line 78. While a non-limiting example of the power input connector 70 has been illustrated as three conductive regions, alternative power input connectors 70 may be envisioned. For example, alternative embodiments of the disclosure may further subdivide the three conductive regions to define additional conductive or contact regions. In such embodiments, the routing of power may be accordingly configured.

When the electronics card 40 is selectively received in a respective slot 44, in the direction indicated by arrow 80, the top edge 72 of the card 40 can be received through one or more electrical contacts 56 that extend through the wall 36 into the rack assembly 30. In this example, the top edge 72 of the card 40 can be further guided or aligned with the electrical contacts 56 by way of a keyed or guided pathway of the respective slot 44 or rack assembly 30. Furthermore, the at least one of the electronic cards 40, rack assembly 30, and or electrical contacts 56 can be configured such that when the card 40 is fully received by the slot 44, the electrical contacts 56 are properly aligned with and electrically couple with a respective power input connector 70 on the top edge 72 of the electronic card 40. Additional configurations for ensuring proper alignment of the top edge 72 or power input connector 70 with the one or more electrical contacts 56 can be included with at least one of the electronic card 40, slot 44, or rack assembly 30.

Figure 5:
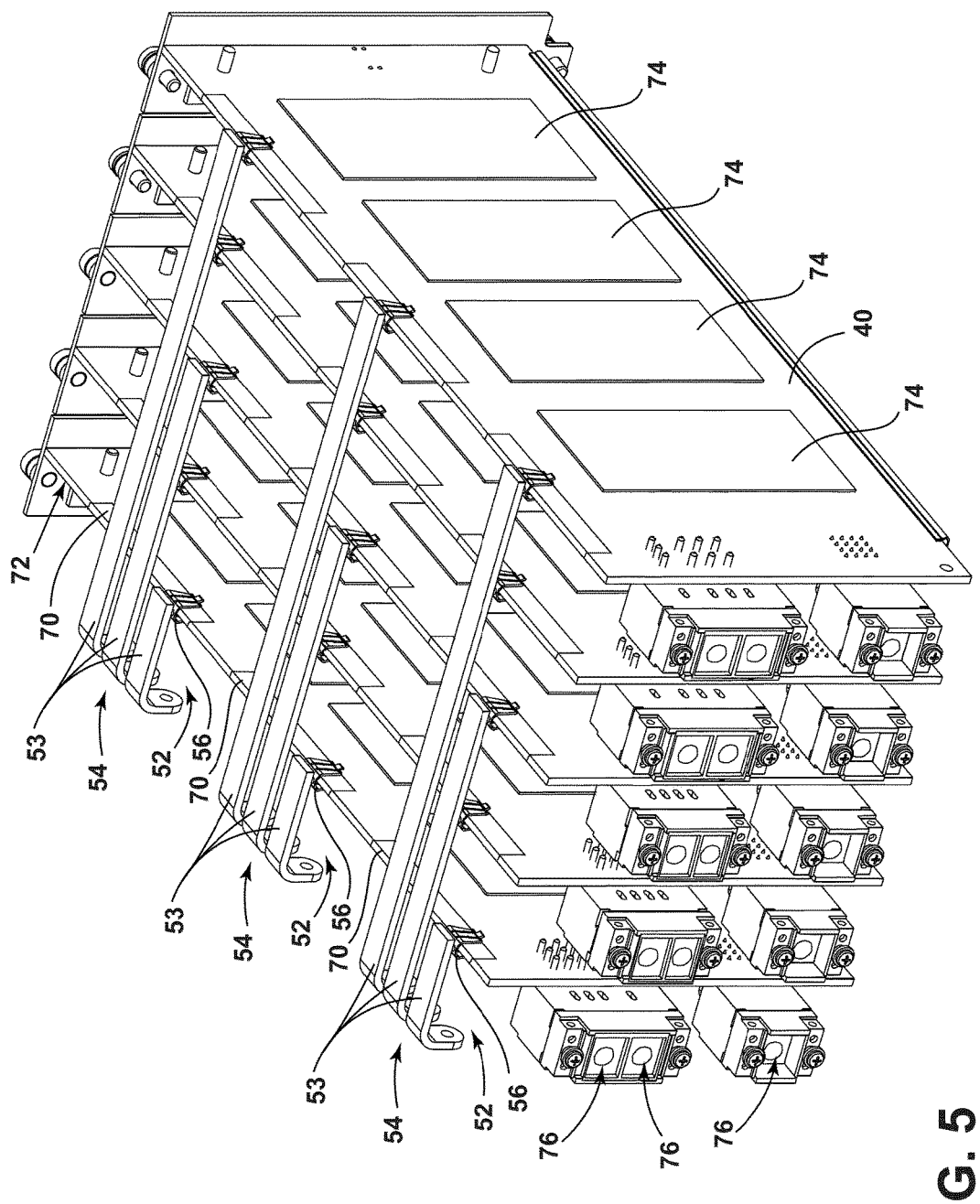
FIG. 5 is the partial perspective view of FIG. 4, showing the assembled bus bar conductors and electronic cards, wherein the rack assembly walls have been removed for ease of understanding.

In this sense, when the slot 44 of the rack assembly 30 has fully or properly received an electronic card 40, an electrical pathway or continuity is defined such that power is received from the power source, such as the generator 18, at the first end 54 of a segment 53 or set of bus bar conductors 52, is delivered from the segment 53 or set of bus bar conductors 52 to the electronic card 40 via at least one electrical contact 56 and corresponding power input connector 70, wherein it is received by at least one power electronics component 74 on the electronic card 40. The power electronics component 74 can act upon the power, e.g., performing some sort of switching or conversion operation, and deliver the power to at least one power output connector 76 on the electronic card 40, which is further electrically connected to at least one electrical load 20. FIG. 5 illustrates a configuration of FIG. 4, wherein the electronic card 40 is electrically coupled with the sets of bus bar conductors 52, via a set of electrical contacts 56 aligned with the power input connectors 70 of the card 40. In this sense, FIG. 5 illustrates how the electronic card 40 would be fully received within the slot 44 of the rack assembly 30.

While the electronic card 40 is shown having three conductive regions (power input connectors 70) coupled with one electrical contact 56 and segment 53 of the set of bus bar conductors 52, alternative configurations are contemplated. For example, while the illustrated example can provide the electronic card 40 with three-phase AC power (e.g. one phase from the corresponding segment 53 or set of bus bar conductors 52, other electronic cards 40 received in other slots 44 of the rack assembly can receive a single phase, or two phases of AC power, or one or more DC power inputs. The electronic card 40 can be specially configured or selected to, for example, receive a desired power input (for example, at fewer power input connectors 70, or at power input connectors 70 configured along the top edge 72 to only align with desired power input electrical contacts 56), and provide for the proper power outputs after switching or converting operations.

The selectability and configurability of the embodiments described herein can define a modular power distribution rack assembly 30 for distributing power from a power source (such as the generator 18) to a set of power output connectors 76 or at least one electrical load 20 of an aircraft 10. For example, a known set of electrical loads 20 in a portion of an aircraft 10 can define a predetermined or desired set of electrical outputs 76. Knowing the desired electrical outputs 76 and a set of power supplied by the power source, a set of electronic cards 40 can be selected to modify the power supplied by the power source to the desired electrical outputs 76. In this sense, the electronic cards 40 are selectable or modular based at least in part on the power supplied and the desired electrical output 76. The electronic cards 40 can further be arranged and received in the rack assembly 30 at the power distribution node 16, wherein at least one of the wall 36, bus bar channels 50, or channel apertures 62 can be selected to provide access to the electronic cards 40 selected. In this sense, at least one of the wall 36, bus bar channels 50, or channel apertures 62 are selectable or modular based at least in part on the set of electronic cards 40 selected.

Moreover, the arrangement of the set of electronic cards 40, the wall 36, the bus bar channels 50, the channel apertures 62, and the power supplied by the power source, the power rack assembly 30 can be further customized by selecting segments 53 or sets of bus bar conductors 52 having electrical contacts 56 corresponding to at least one of the set of electronic cards 40, the power input connectors 70, or the channel apertures 62, wherein the desired power inputs are properly supplied via the first end 54 of the segments 53 or sets of bus bar conductors 52, through the electrical contacts 56 extending into the manifold 32 through the channel apertures 62, to the power input connectors 70 of the set of electronic cards 40. In this sense, the arrangement of segments 53, sets of bus bar conductors 52, and electrical contacts 56 are selectable or modular based at least in part on the power supplied by the power source, or the previously described arrangements.

Further selections of modular components to ensure electrical isolation of the segments 53 or sets of bus bar conductors 52 can be determined or selected, as described herein. The further selections can include, for example, but not be limited to, the non-conductive segments or covers 64. Utilizing the modular components described above, a power distribution node 16 can be selectively configured or determined to include a set of electronic cards 40 for modifying or routing known or predetermined power from a power source to a power output desired for a known or predetermined set of electrical outputs 76 or loads 20.

Figure 6:
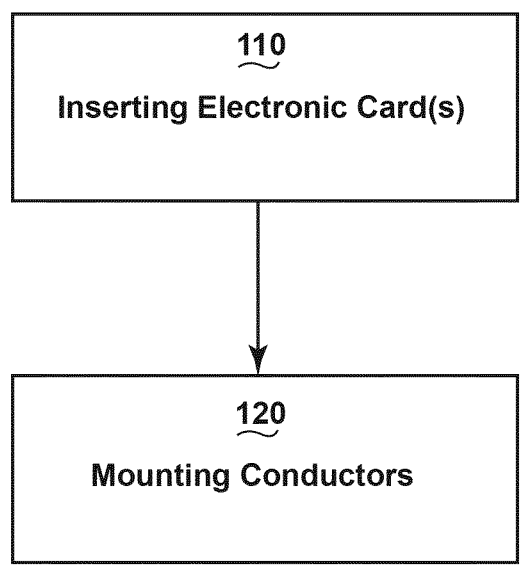
FIG. 6 is a flowchart of the method for distributing power from the power source to a set of power output connectors.

FIG. 6 illustrates an example method 100 of distributing power from the power source, such as a generator 18, to a set of power output connectors 76. The method 100 can include an "inserting step" 110 of inserting into a set of slots 44 in a rack assembly 30, a set of electronic cards 40 having a set of power input connectors 70, such as conductive regions, a set of power output connectors 76, and at least one power electronics 74 configured to route power received at the set of power input connectors 70 to the set of power output connectors 76. The method 100 can further include a "mounting step" 120 of mounting to a wall of the rack assembly 30 a set of bus bar conductors 52 having connectors to a power source, for example, the first end 54 of the segments 53 and electric contacts, such as the electrical contacts 56, extending through the wall to couple with the respective power input connectors 70 of the electronic cards 40. The method 100 can be implemented such that the set of electronic cards 40, the set of bus bar conductors 52, and the electrical contacts 56 are selected and arranged to distribute power from the generator 18 to the set of power output connectors 76. The aforementioned modularity can be further implemented by selecting or arranging a subset of bus bar conductors 52 in selected bus bar channels 50, and selecting and or arranging a subset of electrical contacts 56 on the subset of bus bar conductors 52 to configure power distribution to selected to selected electronic cards 40, received in selected slots 44 in the manifold 32.

The sequence depicted is for illustrative purposes only and is not meant to limit the method 100 in any way as it is understood that the portions of the method can proceed in a different logical order, additional or intervening portions can be included, or described portions of the method can be divided into multiple portions, or described portions of the method can be omitted without detracting from the described method. For example, the mounting step 120 can occur before the inserting step 110.

Many other possible embodiments and configurations in addition to that shown in the above figures are contemplated by the present disclosure. For example, one embodiment contemplates a rack assembly 30 with a rear wall having a set of openings corresponding to the power output connectors 76 of the respective electronic card 40. In this embodiment, the openings of the rear wall can be keyed to a selected or specific at least one power output connector 76 or electronic card 40. In another example, the rack assembly 30 itself can be selectable based on the configuration, as explained above. For instance, a power distribution node 16 that only requires three electronic cards 40 can select a rack assembly having exactly three slots 44 to minimize installation volume in the aircraft 10. Additionally, the design and placement of the various components can be rearranged such that a number of different in-line configurations could be realized.

The embodiments disclosed herein provide a method and apparatus for a power rack assembly for distributing power from a power source to a set of power output connections by utilizing a series of configurable components to tailor or customize the power rack assembly for a particular need or desired power distribution node. One advantage that can be realized in the above embodiments is that the tailoring to the particularized power distribution needs can reduce the number of unnecessary components included in the distribution node (e.g. spring clips that don't couple to electronic cards, or segments or sets of conductors for power supplies that are unnecessary, etc.). Furthermore, the rack assembly itself can be selected to only provide a limited number of slots tailored to the expected number of electronic cards required for particular node operations. By reducing the number of components and reducing the total installation package volume, the above-described embodiments of the invention have superior weight and size advantages over the conventional power distribution systems.

Another advantage to the above-described embodiments is that by reducing the number of unnecessary components can reduce the cost for the power distribution rack assembly or node. Moreover, a decreased number of parts as the system will make the distribution system, rack assembly, or node inherently more reliable. Yet another advantage to the above-described embodiments is that the smaller installation volume of the rack assembly can allow for the installation of the assembly closer to the electrical loads being serviced by the node. This closer proximity results in a reduction of interconnecting wire lengths with the assembly output, and hence a corresponding weight reduction due to wiring.

When designing aircraft components, important factors to address are size, weight, and reliability. The above described power distribution rack results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various embodiments can be used in combination with others as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" various elements have been described, it will be understood that "a set" may include any number of the respective elements, including only one element. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power distribution rack assembly comprising:
a manifold defining an interior having a set of slots within the manifold, a wall having an outer surface with a set of bus bar channels extending along at least a portion of the outer surface normal to the slots, the set of bus bar channels having a set of apertures in the wall;
at least one electronic card having at least one power input connector, at least one power output connector, and power electronics configured to route power received at the at least one power input connector to the at least one power output connector, and wherein the at least one electronic card is configured to be received in the set of slots in the interior of the manifold; and a set of bus bar conductors received in the set of bus bar channels, and adapted to receive power from a power source, the set of bus bar conductors having at least one electrical contact connected thereto and that extend from the outer surface through the set of apertures to the interior of the manifold;

wherein the at least one electronic card is received in the set of slots, and the set of bus bar conductors is received in the set of bus bar channels, with the at least one electrical contact selectively coupled with the at least one power input connector to selectively configure continuity between the power source and the at least one power output connector.

2. The rack assembly of claim 1, wherein the manifold has a second wall with a set of openings corresponding to the at least one power output connector.

3. The rack assembly of claim 1, further comprising a non-conductive cover overlying set of bus bar channels.

4. The rack assembly of claim 1, wherein the set of bus bar conductors has connectors that extend past the wall and connect to the power source.

5. The rack assembly of claim 1, wherein a subset of the bus bar conductors is configured to receive one of AC power or DC power from the power source.

6. The rack assembly of claim 1, wherein the at least one electrical contact is a spring clip.

7. The rack assembly of claim 1, wherein the set of bus bar channels extend along the outer surface of a common wall of the manifold.

8. The rack assembly of claim 7, wherein each of the at least one power input connector is on a common edge of the at least one electronic card, and wherein the common edge is the at least one electronic card edge closest to the common wall of the manifold.

9. A power distribution rack comprising:
a set of slots included in a manifold having an outer surface and an interior, the manifold configured to receive a set of electronic cards having at least one power input connector, at least one power output connector, and power electronics configured to route power received at the at least one power input connector to the at least one power output connector;
a set of bus bar channels disposed at the outer surface of the manifold normal to the set of slots;
at least one aperture positioned in the set of bus bar channels providing access to a set of electronic cards received in the set of slots; and
a set of bus bar conductors received in the set of bus bar channels, and configured to connect to a power source, the set of bus bar conductors having at least one electrical contact connected thereto and extending from the outer surface through the at least one aperture to the interior of the manifold;
wherein the at least one electrical contact can be coupled with the at least one power input connector of a set of electronic cards received in the set of slots to establish continuity between the power source and the at least one power output connector.

10. The power distribution rack of claim 9, wherein the manifold has a wall with a set of openings corresponding to the at least one power output connector.

11. The power distribution rack of claim 10, wherein the set of openings is keyed to the at least one power output connector.

12. The power distribution rack of claim 9, further comprising a non-conductive cover overlying set of bus bar channels.

13. The power distribution rack of claim 9, wherein the set of bus bar conductors has connectors extending past the set of bus bar channels and connect to the power source.

14. The power distribution rack of claim 9, wherein the set of slots is further configured to receive a set of parallel electronics cards.

15. The power distribution rack of claim 9, wherein a subset of the bus bar conductors is configured to receive one of AC power or DC power from the power source.

16. The power distribution rack of claim 9, wherein the at least one electrical contact is a spring clip.

17. A modular bus bar connection system comprising:
a manifold having an outer surface and defining an interior having a set of slots that receive a set of electronic cards;
a set of bus bar channels disposed in the outer surface of a wall of the manifold normal to the set of slots and having a set of apertures through the wall;
a set of bus bar segments received in the set of bus bar channels and having at least one end that couples with a power source; and
a set of electrical contacts coupled with the set of bus bar segments and that extend from the outer surface through the set of apertures to the interior of the manifold and couple with a set of electronic cards received in the set of slots;
wherein the set of bus bar segments is selected and arranged in the set of bus bar channels to couple with at least a subset of electronic cards received in the set of slots.

18. The modular bus bar connection system of claim 17, wherein the set of bus bar segments has varying lengths.

19. The modular bus bar connection system of claim 17, further comprising a set of non-conductive covers for the set of bus bar channels.

20. The modular bus bar connection system of claim 17, wherein the set of electrical contacts includes a spring clip.

* * * * *